US010886955B2

(12) United States Patent
Banowetz et al.

(10) Patent No.: US 10,886,955 B2
(45) Date of Patent: *Jan. 5, 2021

(54) PARALLEL USE OF SERIAL CONTROLS IN IMPROVED WIRELESS DEVICES AND POWER AMPLIFIER MODULES

(71) Applicant: Skyworks Solutions, Inc., Irvine, CA (US)

(72) Inventors: Matthew Lee Banowetz, Marion, IA (US); Philip H. Thompson, Cedar Rapids, IA (US); Edward James Anthony, Robins, IA (US); James Henry Ross, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/246,344

(22) Filed: Jan. 11, 2019

(65) Prior Publication Data

US 2019/0222240 A1 Jul. 18, 2019

Related U.S. Application Data

(63) Continuation of application No. 15/634,841, filed on Jun. 27, 2017, now Pat. No. 10,218,393, which is a
(Continued)

(51) Int. Cl.
*H04B 1/04* (2006.01)
*H03F 1/02* (2006.01)
(Continued)

(52) U.S. Cl.
CPC ......... *H04B 1/0475* (2013.01); *H03F 1/0222* (2013.01); *H03F 3/00* (2013.01);
(Continued)

(58) Field of Classification Search
CPC ....... H04L 5/14; H03F 2200/451; H03F 3/24; H03F 1/0222; H03F 3/189;
(Continued)

(56) References Cited

U.S. PATENT DOCUMENTS 8,023,909 B2 9/2011 Ripley et al.
8,135,881 B1 3/2012 Obkircher
(Continued)

FOREIGN PATENT DOCUMENTS

| CN | 102474223 A | 5/2012 |
|---|---|---|
| CN | 103999368 A | 8/2014 |
| CN | 104144527 A | 11/2014 |

OTHER PUBLICATIONS

First Office Action dated Jan. 14, 2019 in connection with Chinese Patent App. No. 201610873010.5 in 5 pages.

*Primary Examiner* — Rahel Guarino
(74) *Attorney, Agent, or Firm* — Knobbe, Martens, Olson & Bear, LLP (57) ABSTRACT

A power amplifier module can include one or more switches, a coupler module, input signal pins, and a controller having first and second output terminals. The input signal pins can receive a voltage input/output signal, a clock input signal, and a data input signal. The controller can (i) set a mode of the one or more switches using a synchronous communication protocol in which the controller outputs a synchronous clock signal on the first output terminal and a data signal on the second output terminal, when the power amplifier module is in a first operating mode, or (ii) set a mode of the coupler module using an asynchronous communication protocol in which the controller outputs a first asynchronous control signal on the first output terminal and a second asynchronous control signal on the second output terminal, when the power amplifier module is in a second operating mode.

20 Claims, 7 Drawing Sheets

Related U.S. Application Data continuation of application No. 15/280,885, filed on Sep. 29, 2016, now Pat. No. 9,722,771.

(60) Provisional application No. 62/235,415, filed on Sep. 30, 2015.

(51) Int. Cl.

| | |
|---|---|
| *H03F 3/19* | (2006.01) |
| *H03F 3/24* | (2006.01) |
| *H03G 3/30* | (2006.01) |
| *H04L 7/00* | (2006.01) |
| *H04L 7/04* | (2006.01) |
| *H03F 3/00* | (2006.01) |
| *H03G 3/00* | (2006.01) |

(52) U.S. Cl.
CPC ............... *H03F 3/19* (2013.01); *H03F 3/24* (2013.01); *H03F 3/245* (2013.01); *H03G 3/00* (2013.01); *H03G 3/3042* (2013.01); *H04B 1/0458* (2013.01); *H04B 1/0483* (2013.01); *H04L 7/0091* (2013.01); *H04L 7/04* (2013.01); *H03F 2200/102* (2013.01); *H03F 2200/111* (2013.01); *H03F 2200/451* (2013.01); *H04B 2001/0408* (2013.01); *H04B 2001/0433* (2013.01)

(58) Field of Classification Search
CPC .. H03F 2200/111; H03G 3/00; H03G 3/3042; H04B 1/006; H04B 1/48; H04B 1/0475; H04B 1/0483; H04B 2001/0408; H04B 2001/0433
See application file for complete search history.

(56) References Cited

U.S. PATENT DOCUMENTS

| | | | |
|---|---|---|---|
| 9,092,393 | B2 | 7/2015 | Whitefield et al. |
| 9,189,430 | B2 | 11/2015 | Ross et al. |
| 9,722,771 | B2* | 8/2017 | Banowetz ............ H03F 1/0222 |
| 10,218,393 | B2* | 2/2019 | Banowetz ............... H03F 3/245 |
| 2005/0152311 | A1* | 7/2005 | Park .................. H04W 56/0015 370/331 |
| 2012/0223774 | A1 | 9/2012 | Southcombe et al. |
| 2012/0269240 | A1* | 10/2012 | Balteanu ............... H03F 1/0211 375/219 |
| 2014/0002188 | A1 | 1/2014 | Chen et al. |
| 2014/0213204 | A1 | 7/2014 | Balteanu et al. |
| 2017/0003733 | A1 | 1/2017 | Banowetz |

* cited by examiner

PARALLEL USE OF SERIAL CONTROLS IN IMPROVED WIRELESS DEVICES AND POWER AMPLIFIER MODULES

RELATED APPLICATION

This disclosure claims priority to U.S. patent application Ser. No. 15/634,841, filed on Jun. 27, 2017 and titled "PARALLEL USE OF SERIAL CONTROLS IN IMPROVED WIRELESS DEVICES AND POWER AMPLIFIER MODULES," which claims priority to U.S. patent application Ser. No. 15/280,885, filed on Sep. 29, 2016 and titled "PARALLEL USE OF SERIAL CONTROLS IN IMPROVED WIRELESS DEVICES AND POWER AMPLIFIER MODULES," which claims the benefit of U.S. Provisional Application No. 62/235,415, filed on Sep. 30, 2015 and titled "PARALLEL USE OF SERIAL CONTROLS IN IMPROVED WIRELESS DEVICES AND POWER AMPLIFIER MODULES," the disclosures of which are expressly incorporated by reference herein in their entirety for all purposes.

BACKGROUND

Technical Field

This disclosure relates to power amplifier modules and, in particular, to serial interfaces for controlling power amplifier modules.

Description of Related Technology

Various electronic systems can include a serial interface to control various components within the electronic systems. For example, such a serial interface can be used to write data to and/or read data from one or more integrated circuits (ICs). Data can be transmitted over such a serial interface according to a synchronous communication protocol, where a clock signal is used to synchronize the data transmission.

SUMMARY

The systems, methods, and devices of this disclosure each have several innovative aspects, no single one of which is solely responsible for all of the desirable attributes disclosed herein. Details of one or more implementations of the subject matter described in this specification are set forth in the accompanying drawings and the description below.

Certain aspects of the present disclosure relate to a power amplifier module. The power amplifier module may include one or more switches, a coupler module, a plurality of input signal pins, and a controller having at least first and second output terminals. The plurality of input signal pins may be configured to receive a plurality of input signals including a voltage input/output (VIO) signal, a clock input signal, and a data input signal. The controller may be configured, when the power amplifier module is in a first operating mode, to set a mode of the one or more switches using a synchronous communication protocol in which the controller outputs a synchronous clock signal on the first output terminal and a data signal on the second output terminal. The synchronous clock signal may have a constant frequency. The controller may be further configured, when the power amplifier module is in a second operating mode, to set a mode of the coupler module using an asynchronous communication protocol in which the controller outputs a first asynchronous control signal on the first output terminal and a second asynchronous control signal on the second output terminal.

In certain embodiments, the controller is further configured to determine whether the power amplifier module is in the first operating mode or in the second operating mode based at least in part on the data input signal. In some implementations, the controller may further include a third output terminal. In such implementations, the controller may be further configured to assert an enable signal during communication using the synchronous communication protocol. In some of such embodiments, the controller may be further configured to de-assert the enable signal during communication using the asynchronous communication protocol.

In some designs, the first and second asynchronous control signals may be provided to the coupler module while the power amplifier module is transmitting data via one or more antennas connected to the power amplifier module. In some embodiments, the controller may be further configured to determine logic levels of the first and second asynchronous control signals provided in the second operating mode based at least in part on the data input signal. In some of such embodiments, the controller may further include one or more latches configured to store and maintain the logic levels of the first and second asynchronous control signals from a first time period when the power amplifier module switches from the second operating mode to the first operating mode until a second time period when the power amplifier module switches from the first operating mode to the second operating mode.

Certain aspects of the present disclosure relate to a method for controlling one or more components of a power amplifier module in a wireless device. The method may include receiving a plurality of input signals via a serial interface of the power amplifier module; determining, based on the plurality of input signals, whether the power amplifier module is in a first operating mode or a second operating mode; in response to determining that the power amplifier module is in the first operating mode, setting a mode of one or more switches using a synchronous communication protocol at least by outputting a synchronous clock signal and a data signal; and in response to determining that the power amplifier module is in the second operating mode, setting a mode of the coupler module using an asynchronous communication protocol at least by outputting a first asynchronous control signal and a second asynchronous control signal. The synchronous clock signal may have a constant frequency.

In certain embodiments, the method further includes determining whether the power amplifier module is in the first operating mode or in the second operating mode based at least in part on the plurality of input signals received via the serial interface. In some implementations, the method may further include asserting an enable signal during communication using the synchronous communication protocol. In some of such implementations, the method may further include de-asserting the enable signal during communication using the asynchronous communication protocol wherein the first and second control signals are provided to the coupler module in an asynchronous manner.

In some designs, the first and second asynchronous control signals may be provided to the coupler module while the power amplifier module is transmitting data via one or more antennas connected to the power amplifier module. In some implementations, the method may further include determining logic levels of the first and second asynchronous control signals based at least in part on the plurality of input signals received via the serial interface. In some of such implementations, the method may further include storing and maintaining, in one or more latches, the logic levels of the first and second asynchronous control signals from a first time period when the power amplifier module switches from the second operating mode to the first operating mode until a second time period when the power amplifier module switches from the first operating mode to the second operating mode.

Certain aspects of the present disclosure relate to a wireless communication device. The wireless communication device may include a transceiver configured to output a plurality of transmission paths, an antenna configured to output a signal corresponding to at least one of the transmission paths, and a power amplifier module in communication with the transceiver and the antenna and having one or more switches, a coupler module, a plurality of input signal pins configured to receive a plurality of input signals, and a controller having at least first and second output terminals. The controller may be configured, when the power amplifier module is in a first operating mode, to set a mode of the one or more switches using a synchronous communication protocol in which the controller outputs a synchronous clock signal on the first output terminal and a data signal on the second output terminal. The controller may be further configured, when the power amplifier module is in a second operating mode, to set a mode of the coupler module using an asynchronous communication protocol in which the controller outputs a first asynchronous control signal on the first output terminal and a second asynchronous control signal on the second output terminal.

In certain embodiments, the power amplifier module may be configured to refrain from providing the synchronous clock signal to the one or more switches when the wireless communication device is transmitting data via the antenna. In some implementations, the controller may be further configured to change the mode of the coupler module only when the power amplifier module is in the second operating mode.

DETAILED DESCRIPTION

The headings provided herein, if any, are for convenience only and do not necessarily affect the scope or meaning of the claimed invention. Provided herein are various non-limiting examples of devices and methods for use with serial interfaces.

Example of a Power Amplifier Module

Figure 1:
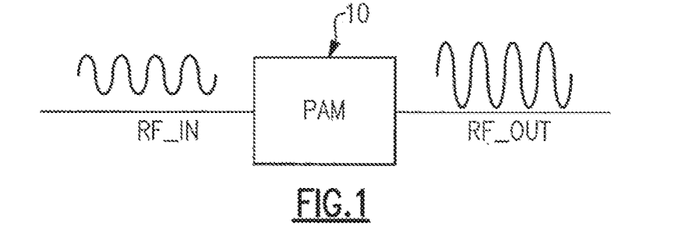
FIG. 1 is a schematic diagram of a power amplifier module for amplifying a radio frequency (RF) signal.

FIG. 1 is a schematic diagram of a power amplifier module (PAM) 10 for amplifying a radio frequency (RF) signal. The illustrated power amplifier module 10 amplifies an RF signal (RF_IN) to generate an amplified RF signal (RF_OUT). The power amplifier module 10 can include a serial interface implemented using one or more features of the present disclosure.

RF power amplifiers can be used to boost the power of a RF signal having a relatively low power. Thereafter, the boosted RF signal can be used for a variety of purposes, included driving the antenna of a transmitter.

Power amplifiers can be included in mobile phones to amplify a RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal. It can be important to manage the amplification of a RF signal, as a desired transmitted power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is varied in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

In some implementations, a directional coupler may be positioned in the transmit path to measure output power and linearity, and appropriate corrections may be made to the power amplifiers to achieve a balance between battery life and radio performance.

Example of a Wireless Device

Figure 2:
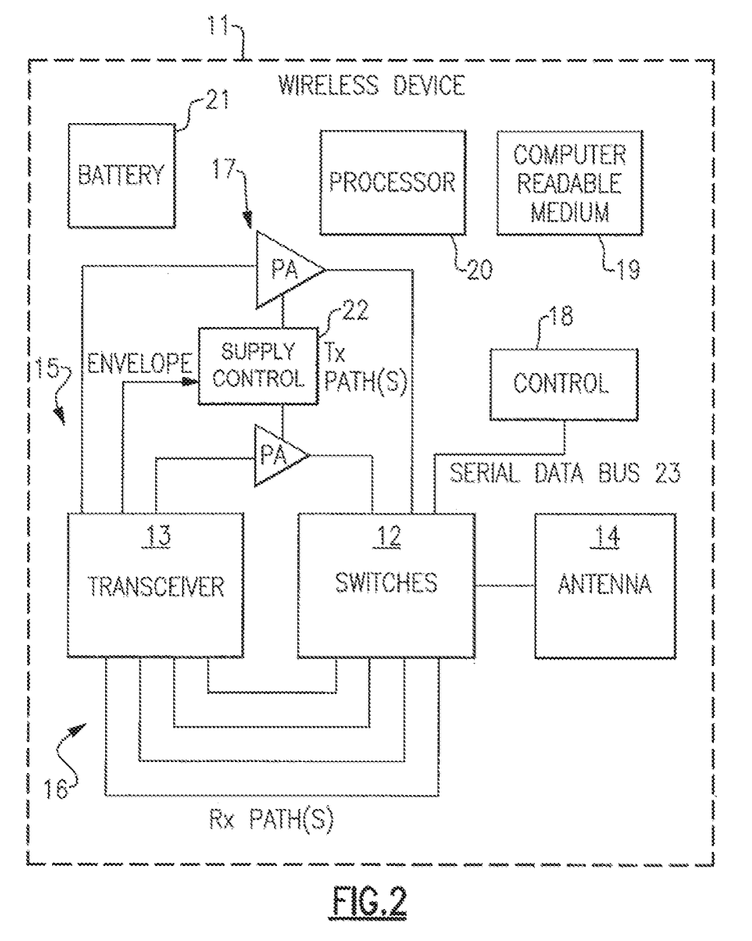
FIG. 2 is a schematic block diagram of an example wireless device that can include one or more of the power amplifier modules of FIG. 1.

FIG. 2 is a schematic block diagram of an example wireless communication or mobile device 11. The wireless device 11 can include a serial interface implemented using one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver component 13, an antenna 14, power amplifiers 17, a control component 18, a computer readable medium 19, a processor 20, a battery 21, a supply control block 22, and a serial data bus 23.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15 and two power amplifiers 17, the wireless device 11 can be adapted to include more or fewer transmission paths 15 and/or more or fewer power amplifiers.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals. For example, the switches 12 can be a front-end module for a transceiver, and can include one or more duplexers. The switches 12 can include a serial interface, as will be described herein.

Although not illustrated in FIG. 2, an RF coupler can be disposed between the switches 12 and the antenna 14 or between the power amplifiers 17 and the switches 12. The RF coupler can provide an indication of forward power provided to the antenna 14 and/or an indication of reverse power reflected from the antenna 14. The indications of forward and reverse power can be used, for example, to compute a reflected power ratio, such as a return loss, a reflection coefficient, or a voltage standing wave ratio (VSWR). The RF coupler can implement any of the principles and advantages of the RF couplers discussed herein.

FIG. 2 shows that in certain embodiments, a control component 18 can be provided for controlling various control functionalities associated with operations of the switches 12, the power amplifiers 17, the envelope tracking block 22, and/or other operating components. For example, the control component 18 can provide instructions to the switches 12 via the serial data bus 23. As another example, the control component 18 can provide control signals to configure an RF coupler in accordance with any of the principles and advantages discussed herein.

In certain embodiments, a processor 20 can be configured to facilitate implementation of various processes described herein. In an embodiment, the processor 20 can include a serial interface, as will be described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the supply control block 22, which can be used to provide a power supply voltage to one or more of the power amplifiers 17. For example, the supply control block 22 can include an envelope tracker configured to control or vary the voltage level of the supply voltage provided to the power amplifiers 17 based upon an envelope of the RF signal to be amplified. However, in certain implementations the supply control block 22 can include different components.

The supply control block 22 can be electrically connected to the battery 21, and the supply control block 22 can be configured to generate the supply voltage for the power amplifiers 17. The battery 21 can be any suitable battery for use in the wireless device 11, including, for example, a lithium-ion battery. As will be described in detail further below, by varying the voltage provided to the power amplifiers, the power consumed from the battery 21 can be reduced, thereby improving performance of the battery life of the wireless device 11. In certain implementations, the supply control block 22 can control the power amplifier supply voltage based on an envelope of the RF signal to be amplified. The envelope signal can be provided to the supply control block 22 from the transceiver 13. However, the envelope can be determined in other ways. For example, the envelope can be determined by detecting the envelope from the RF signal using any suitable envelope detector.

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Some of the embodiments described above have provided examples in connection with power amplifiers and/or mobile devices. However, the principles and advantages of the embodiments can be used for any other systems or apparatus, such as any uplink cellular device, that could benefit from any of the circuits described herein. Any of the principles and advantages discussed herein can be implemented in an electronic system with a need for detecting and/or monitoring a power level associated with an RF signal, such as forward RF power and/or a reverse RF power and/or a need for additional control signal lines (e.g., general purpose input/output (GPIO) signal lines). Any of the switch networks and/or switch circuit discussed herein can alternatively or additionally be implemented by any other suitable logically equivalent and/or functionally equivalent switch networks. The teachings herein are applicable to a variety of power amplifier systems including systems with multiple power amplifiers, including, for example, multi-band and/or multi-mode power amplifier systems.

Example of a Power Amplifier Module

Figure 3:
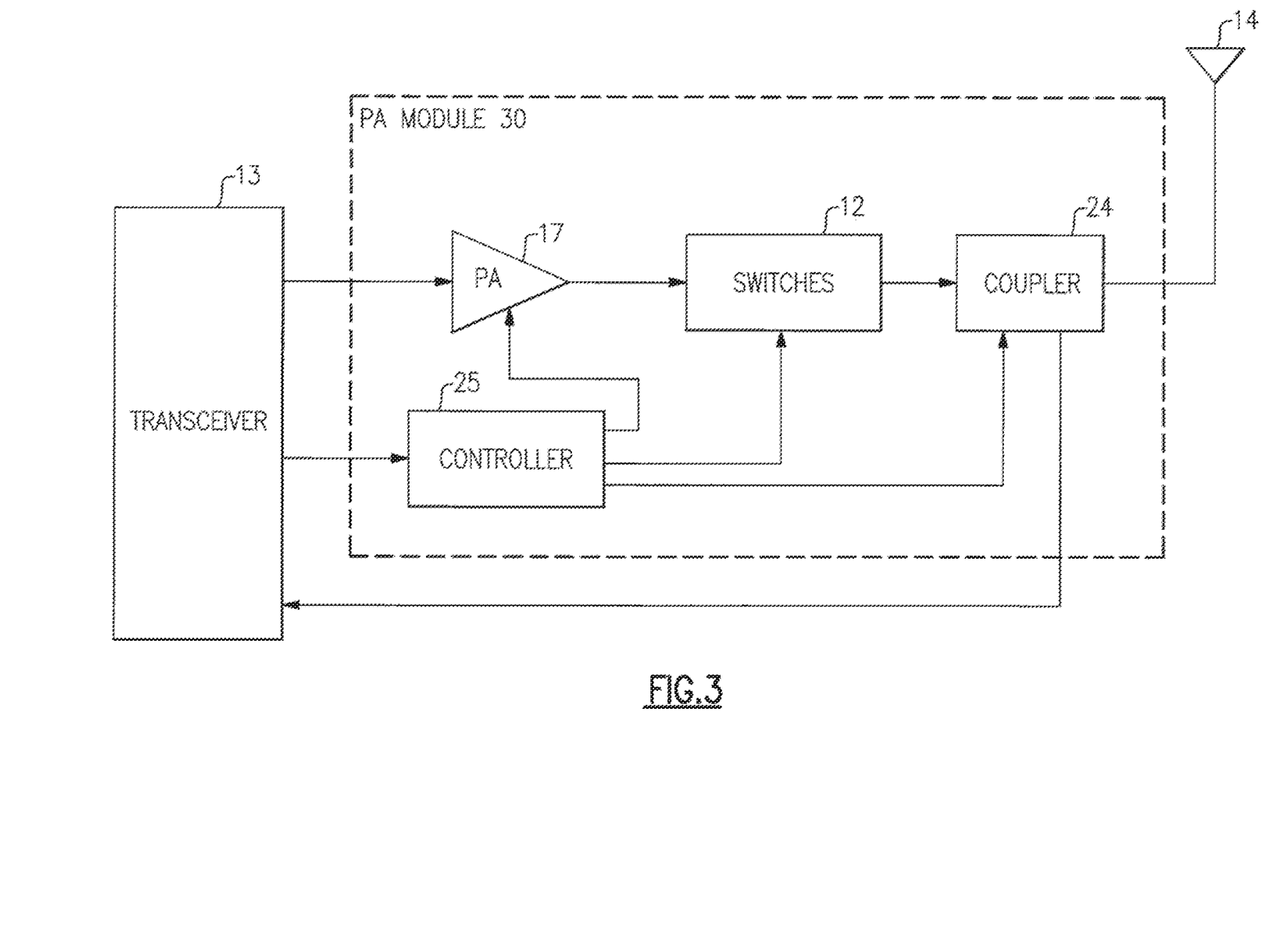
FIG. 3 is a schematic block diagram of an example power amplifier module.

FIG. 3 is a schematic block diagram of one example of a power amplifier module 30. The illustrated power amplifier module 30 includes the switches 12, a directional coupler 24, and a power amplifier 17. In FIG. 3, the power amplifier module 30 is connected to the transceiver 13 and the antenna 14. Although not illustrated in FIG. 3, the transceiver 13 can include a baseband processor, an I/Q modulator, a mixer, an analog-to-digital converter (ADC), circuitry associated with receiving signals over one or more receive paths, and/or other components.

The power amplifier 17 can receive an RF signal from the transceiver 13, and when enabled can provide an amplified RF signal to the antenna 14 via the switches 12. It will be understood that additional elements (not illustrated) can be included in the electronic system of FIG. 3 and/or a sub-combination of the illustrated elements can be implemented.

The power amplifier 17 can amplify an RF signal. The power amplifier 17 can be any suitable RF power amplifier. For instance, the power amplifier 17 can be one or more of a single stage power amplifier, a multi-stage power amplifier, a power amplifier implemented by one or more bipolar transistors, or a power amplifier implemented by one or more field effect transistors. The power amplifier 17 can be implemented on a GaAs die, CMOS die, or a SiGe die, for example.

The directional coupler 24 can extract a portion of the power of the amplified RF signal traveling between the power amplifier 17 and the antenna 14. The directional coupler 24 can generate an indication of forward RF power traveling from the power amplifier 17 to the antenna 14 and/or generate an indication of reflected RF power traveling from the antenna 14 to the power amplifier 17. An indication of power can be provided to an RF power detector (not illustrated). The directional coupler 24 can have four ports: a power input port, a power output port, a coupled port, and an isolated port. In the configuration of FIG. 3, the power input port can receive the amplifier RF signal from the power amplifier 17 and the power output port can provide the amplified RF signal to the antenna 14. A termination impedance can be provided to either the isolated port or to the coupled port. In a bi-directional RF coupler, a termination impedance can be provided to the isolated port in one state and a termination impedance can be provided to the coupled port in another state. When a termination impedance is provided to the isolated port, the coupled port can provide a portion of the power of RF signal traveling from the power input port to the power output port. Accordingly, the coupled port can provide an indication of forward RF power. When a termination impedance is provided to the coupled port, the isolated port can provide a portion of the power of RF signal traveling from the power output port to the power input port. Accordingly, the isolated port can provide an indication of reverse RF power. The reverse RF power can be RF power reflected from the antenna 14 back to the directional coupler 24. The output state of the directional coupler 24 can be set based on one or more control signals provided to the directional coupler 24 from the controller 25. In some embodiments, the directional coupler 24 may include an RF coupler and a switch configured to control the output state of the RF coupler.

The antenna 14 can transmit the amplified RF signal. For instance, when the system illustrated in FIG. 3 is included in a cellular phone, the antenna 14 can transmit an RF signal from the cellular phone to a base station.

In the system of FIG. 3, the switches 12 are included in a signal path between the power amplifier 17 and the directional coupler 24. The switches 12 can selectively electrically connect the antenna 14 to a selected transmit path. The switches 12 can provide a number of switching functionalities. The switches 12 can include a multi-throw switch configured to provide functionalities associated with, for example, switching between transmission paths associated with different frequency bands, switching between transmission paths associated with different modes of operation, switching between transmission and/or receiving modes, or any combination thereof. In another implementation (not illustrated), the directional coupler 24 can be included in the signal path between the power amplifier 17 and the switches 12. However, other configurations of power measurement are possible. It will be understood that additional elements (not illustrated) can be included in the system of FIG. 3 and/or a subcombination of the illustrated elements can be implemented.

In the illustrated configuration, the sensed output signal from the directional coupler 24 is provided to the transceiver 13. By including a feedback path between the output of the power amplifier 17 and the transceiver 13, the RF signal provided to the power amplifier 17 can be dynamically adjusted to improve or optimize the power management operation. For example, configuring the system of FIG. 3 in this manner can aid in controlling the power-added efficiency (PAE) and/or linearity of the power amplifier 17. However, other configurations of power control can be used.

As illustrated in FIG. 3, the controller 25 can provide control signals to the power amplifier 17, the switches 12, and/or the directional coupler 24. For example, the control signals can control the power amplifier 17 by, for example, setting, modifying, or adjusting the amount of power amplification provided by the power amplifier 17. As another example, the control signals can control the mode of operation of the switches 12 and/or the directional coupler 24. For example, the control signals can configure one or more components of the power amplifier module 30 into the proper state based on the input signals received from the transceiver 13 or a baseband subsystem in communication with the transceiver 13.

In certain implementations, the controller 25 can serve as an intermediary or a manager between the power amplifier module 30 and a signal source that determines or sets the mode of operation of the power amplifier module 30, the power amplifier 17, the switches 12, the directional coupler 24, or any other component that can be controlled by the controller 25. The signal source can include any component that is configured to provide signals to the controller 25 that can cause the controller 25 to determine or set the mode of operation of, for example, the power amplifier module 30. For instance, as illustrated in FIG. 3, the signal source can be the transceiver 13. Alternatively, or in addition, the signal source can include a baseband chip, a digital signal processor (DSP), the control component 18 illustrated in FIG. 1, or any other component that can provide one or more signals to the controller 25 to cause the controller 25 to set the mode of operation of the power amplifier module 30, the power amplifier 17, the switches 12, the directional coupler 24, and/or any other component of the wireless device 11.

In one example of a scenario of controlling the power amplifier module 30, the transceiver 17 can provide one or more signals to the controller 25 associated with setting the mode of operation of, or otherwise controlling, the power amplifier module 30. The controller 25 can determine, based on the received signals from the transceiver 17, whether the received signals are to be used for controlling the components of the power amplifier module 30 in a serial mode or a special mode. In some embodiments, in the serial mode, the interface of the controller 25 is used as a serial interface, and in the special mode, the interface of the controller 25 is used as a GPIO interface. The controller 25 can then process the received signals using the identified mode of operation, and based on the outcome of processing the received signals, the controller 25 can provide mode setting signals or any other control signals to the power amplifier 17, the switches 12, and/or the directional coupler 24 in the identified mode. Upon receiving such signals from the controller 25, the power amplifier 17, the switches 12, and/or the directional coupler 24 can set the operating mode or state based on the received signals.

Example of a Controller

Figure 4:
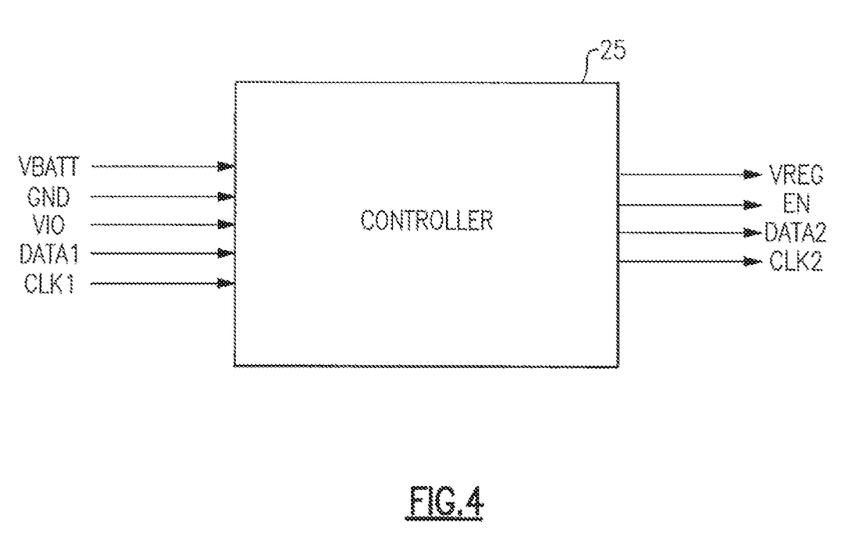
FIG. 4 is a schematic block diagram of an example controller.

FIG. 4 illustrates an embodiment of a controller 25 in accordance with aspects of the present disclosure. The controller 25 can include a serial interface that is configured to operate in different modes. Such modes may include a serial mode in which the signal lines of the serial interface are used for synchronous serial communication and a special mode in which the signal lines of the serial interface are used for asynchronous parallel communication. Advantageously, in certain embodiments, the controller 25 can be implemented in the same size package with the same number of pins as a serial interface that is configured to operate in only one of such modes. The ability to combine multiple interface modes within a single chip without expanding the size of the chip is particularly advantageous for applications that use or require small packages. In some embodiments, the serial interface can include a serial peripheral interface (SPI) or Mobile Industry Processor Interface (MIPI).

As illustrated in FIG. 4, the controller 25 can include a number of input pins (VBATT, GND, VIO, DATA1, and CLK1) and output pins (VREG, EN, DATA2, and CLK2).

The input pins VBATT and GND can be configured to receive a supply voltage and a ground voltage to the power amplifier module 30. For example, the VBATT can be provided by the battery 21 illustrated in FIG. 2.

The input pin VIO can be configured to receive a signal indicating when and whether the controller 25 should be in operation. The input pins DATA1 and CLK1 can be configured to receive a data signal and a corresponding clock signal while the controller 25 is in operation. In one embodiment, the controller 25 is enabled when the VIO receives a logic high signal. For example, the CLK1 and DATA1 may be used to control the controller 25 when the VIO signal is high. However, in some implementations, the controller 25 can be configured to operate when the VIO receives a logic low signal. The logic low signal can be associated with any value defined to be low, such as 0 volts, −5 volts, or otherwise. Similarly, the logic high signal can be associated with any value defined to be high, such as 0 volts, +5 volts, or otherwise. In some implementations, the logic low signal may be associated with connecting the VIO to ground. Similarly, in some cases, the logic high signal may be associated with connecting the VIO to a voltage source.

The controller 25 may include a set of registers (not shown). In certain situations, the set of registers may be set to unknown values. For example, when the wireless device 11 is first powered, the set of registers may be set to unknown values or default values. As another example, the set of registers may be set to values provided via the DATA1 signal line. In such an example, the address of the registers may also be provided via the DATA1 signal line. In other embodiments, the register values and/or the addresses may be provided via a different signal line.

The output pin VREG can be configured to provide a supply voltage to other components of the power amplifier module 30, such as the switches 12 (e.g., band switches, antenna switches, etc.).

The output pin EN can be configured to provide an indication of which mode is currently active (e.g., serial mode or special mode). For example, if EN is high, the DATA2 and CLK2 signals may be provided in the serial mode (e.g., to control the switches 12), and if EN is low, the DATA2 and CLK2 signals may be provided in the special mode (e.g., used to specify the mode of the directional coupler 24). In some embodiments, the controller 25 includes one or more latches configured to store the DATA2 and CLK2 values (or the mode information of the directional coupler 24) when EN goes high (or the mode of operation changes from the special mode to the serial mode), after which the DATA2 and CLK2 signals no longer control the state of the direction coupler 24. By doing so, the controller 25 prevents the fast clock signal provided in the serial mode from rapidly changing the state of the directional coupler 24. Thus, while the controller 25 is providing signals in the serial mode (which can take about 1 microsecond in some embodiments), the state of the directional coupler 24 can remain the same. In some cases, the controller 25 operates in the serial mode when the wireless device 11 is not transmitting, but the state of the directional coupler 24 can be changed while the wireless device 11 is transmitting.

The output pins DATA2 and CLK2 can be configured to provide control signals to the power amplifier 17, the switches 12, the coupler 24, and/or other components of the power amplifier module 30.

In some implementations, the control signals for controlling the output state of the directional coupler 24 can be provided using DATA2 and CLK2 in serial mode. For example, the CLK2 may provide a clock signal (e.g., a fast clock signal running at 20 megahertz) and the DATA2 may serially provide data needed to control the mode of the directional coupler 24. However, in some situations, the fast clock signal provided via CLK2 may interfere with the RF transmission (e.g., with components in the RF transmit path such as the power amplifier 17, the switches 12, filters, and/or other components), for example, via the transmit path of the wireless device 11, if the coupler control were taking place during RF transmit time. In such situations, the interference between the fast clock signal and the RF transmission may cause the wireless device 11 to fail regulatory emission standards or other specifications.

In another embodiment, the controller 25 can include one or more dedicated GPIO signal lines. For example, the dedicated GPIO signal lines can be used to specify the mode of the coupler output using DC signals (e.g., without using a fast clock signal), thereby reducing or eliminating the interference between the control signals provided to the coupler and the RF transmission. However, adding dedicated GPIO signal lines would consume additional board space, which may not be feasible in some implementations (e.g., for applications that use or require small packages).

Therefore, by controlling the state of the directional coupler 24 (or any other component that may need to be controlled during RF transmission of the wireless device 11) in the special mode (e.g., without using a fast clock signal) and controlling other components (e.g., components that may need a lot of configurations relatively fast) in the serial mode, the chance of interference between the control signals and the RF output can be reduced or minimized without requiring additional (or a significant amount of) board space.

In the special mode, the DATA2 and CLK2 signal lines may be used to each provide a signal level (e.g., DC signal) indicating a high or a low, and in combination, the two signals can signal up to 4 states or modes. In some embodiments, one or more GPIO signal lines can be added to the controller 25, and the GPIO signal lines, in combination with the existing DATA2 and CLK2 signal lines, can signal an even greater number of modes to the other components of the power amplifier module 30. For example, if a single GPIO signal line is added to the controller, the combination of the DATA2 and CLK2 signal lines and the additional GPIO signal line can signal up to 8 different modes. In some embodiments, the number of additional signal lines added to the controller 25 may depend on the number of states (e.g., the number of frequency bands being combined, when band switches are controlled in the special mode in a carrier aggregation example).

Example Coupler Output Controlling Process

Figure 5:
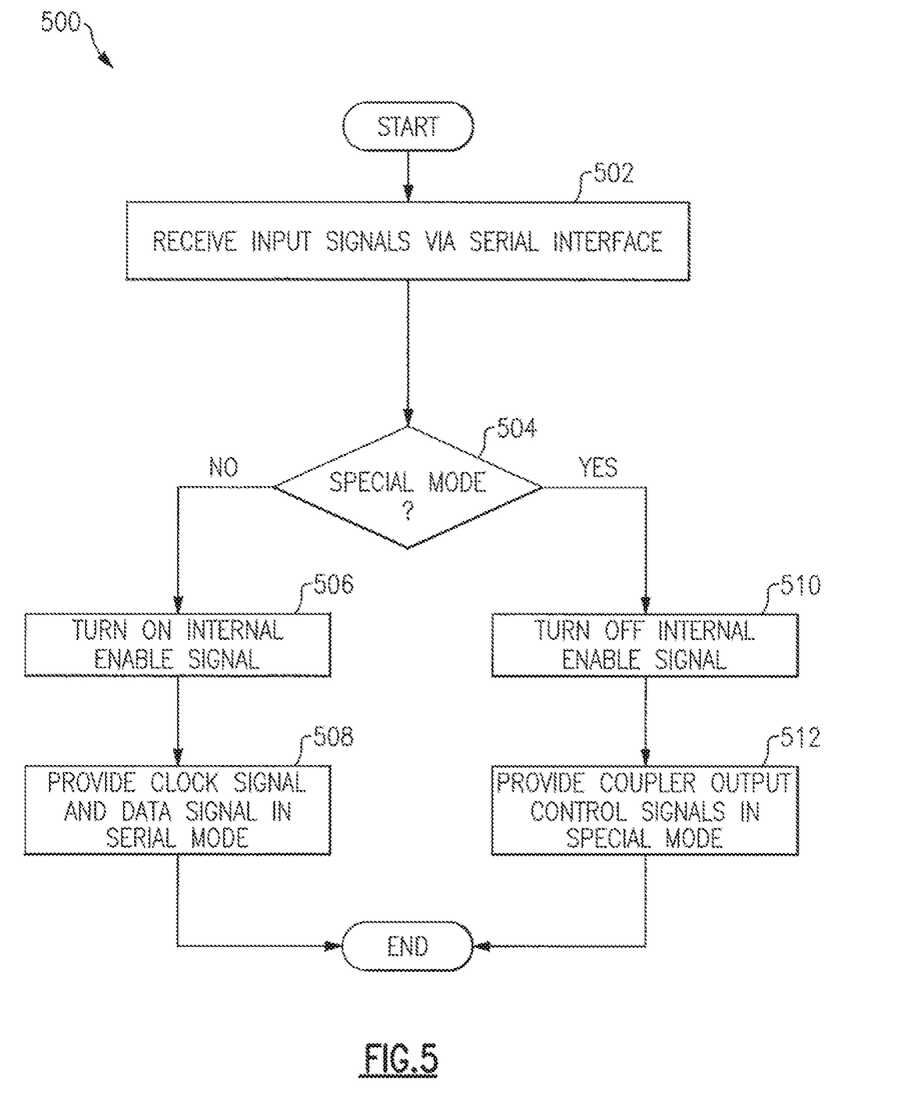
FIG. 5 presents a flowchart of an embodiment of a coupler output controlling process.

FIG. 5 presents a flowchart of a process 500 for operation of the controller 25 in accordance with aspects of the present disclosure. The process 500 may be implemented by any type of digital control interface that is configured to operate as a serial interface for controlling one or more components in the power amplifier module 30. Further, the process 500, in some embodiments, can be implemented by any type of digital control interface that is configured to operate in different interface modes. Although implementation of the process 500 is not limited as such, to simplify discussion, the process 500 will be described as being implemented by the controller 25.

The process 500 begins when, for example, the controller 25 receives input signals at the input pins VIO, DATA1, and CLK1 at block 502. At block 504, the controller 25 determines whether the power amplifier module 30 is in a special mode. The controller 25 may determine whether the power amplifier module 30 is in a special mode based on the received input signals. For example, the controller 25 may determine that the power amplifier module 30 is in the special mode if the DATA1 signal contains a specific sequence of bits (e.g., "0000 0001"). If the controller 25 determines that the power amplifier module 30 is not in the special mode, the process 500 proceeds to block 506. Otherwise, the process 500 proceeds to block 510.

At block 506, the controller 25 turns on an internal enable signal. For example, the controller 25 may cause the EN signal to go from low to high in response to determining that the power amplifier module 30 is not in the special mode. As another example, the controller 25 may cause the EN signal to go from high to low in response to determining that the power amplifier module 30 is not in the special mode.

At block 508, the controller 25 provides a clock signal (e.g., CLK2) and a data signal (e.g., DATA2) to one or more components of the power amplifier module 30 (e.g., power amplifier 17, switches 12, etc.) in a serial mode. The clock signal and the data signal may configure the modes of such components. In some embodiments, the clock signal and the data signal are provided to such components while the wireless device containing the amplifier module 30 is not transmitting data via one or more antennas. The clock signal provided in the serial mode may include a fast clock signal having a frequency greater than 1 megahertz.

At block 510, the controller 25 turns off the internal enable signal. For example, the controller 25 may cause the EN signal to go from high to low in response to determining that the power amplifier module 30 is in the special mode. As another example, the controller 25 may cause the EN signal to go from low to high in response to determining that the power amplifier module 30 is in the special mode. In some embodiments, the EN signal remains off for as long as the power amplifier module 30 is in the special mode.

At block 512, the controller 25 provides one or more coupler output control signals in the special mode to a coupler module (e.g., directional coupler 24). The one or more coupler output control signals may configure the modes of the coupler module. In some cases, the one or more coupler output control signals are provided to such components while the wireless device containing the amplifier module 30 is transmitting data via one or more antennas.

Example Graphs Illustrating Signals

Figure 6:
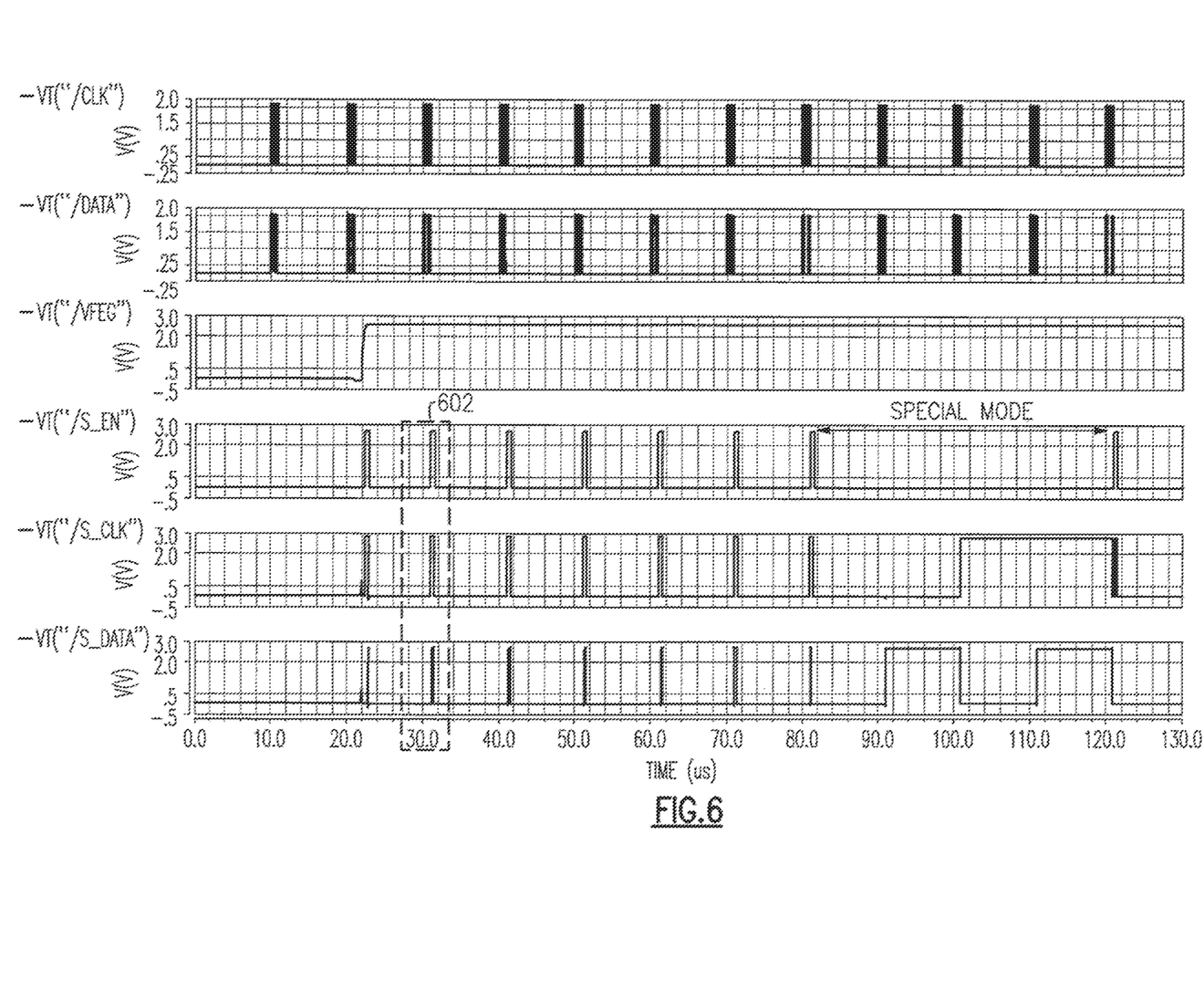
FIG. 6 is a graph illustrating example input and output signals of the controller of FIG. 5.

FIG. 6 is a graph illustrating example input and output signals of the controller of FIG. 5. In the example illustrated in FIG. 6, the top two signals ("/CLK" and "/DATA") correspond to the CLK1 and DATA1 signals illustrated in FIG. 4. Based on the external signals CLK1 and DATA1, the controller 25 provides the bottom four signals ("/VREG," "/S_EN," "/S_CLK," and "/S_DATA"), which respectively correspond to the VREG, EN, CLK2, and DATA2 signals illustrated in FIG. 4. As illustrated in FIG. 6, during the special mode, the controller 25 does not provide a fast clock signal via the CLK2 ("S_CLK") signal line. Instead, the DC values provided via the CLK2 and DATA2 are used to determine the mode of the directional coupler 24 from four available modes.

Figure 7:
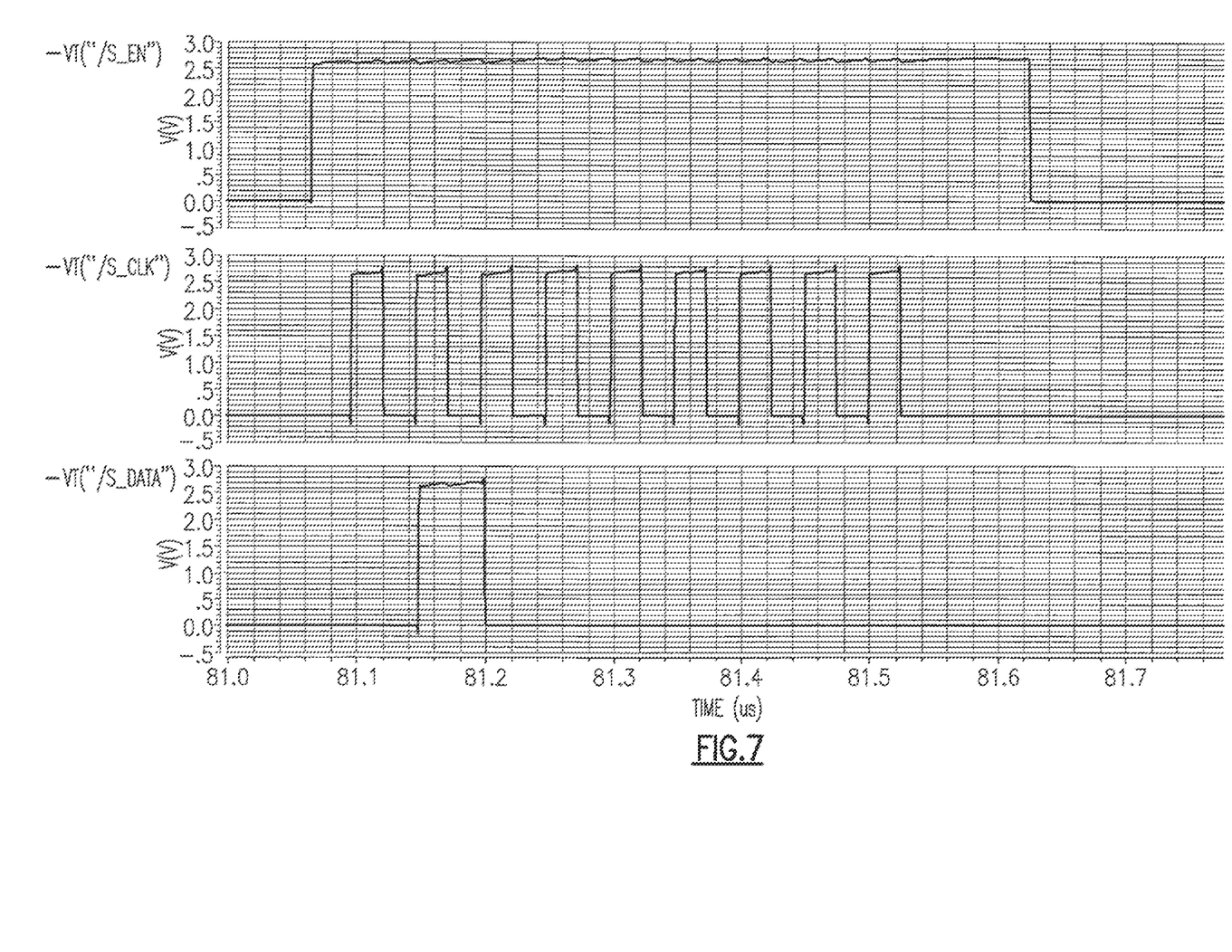
FIG. 7 is a graph illustrating a portion of the output signals illustrated in FIG. 6.

FIG. 7 is a graph illustrating a portion 602 of the output signals illustrated in FIG. 6. The portion 602 illustrated in FIG. 7 may correspond to a combination of signals EN, CLK2, and DATA2 provided to one or more components of the power amplifier module 30. For example, the portion 602 may illustrated the signals provided to a band switch to change the RX path of the band switch, the signals provided to the directional coupler 24 to change the mode of the directional coupler 24, or the signals provided to the power amplifier 17 to change the TX mode of the power amplifier 17. As illustrated in FIG. 7, the signals are transmitted in the serial mode using a fast clock signal CLK2 ("S_CLK").

Figure 8:
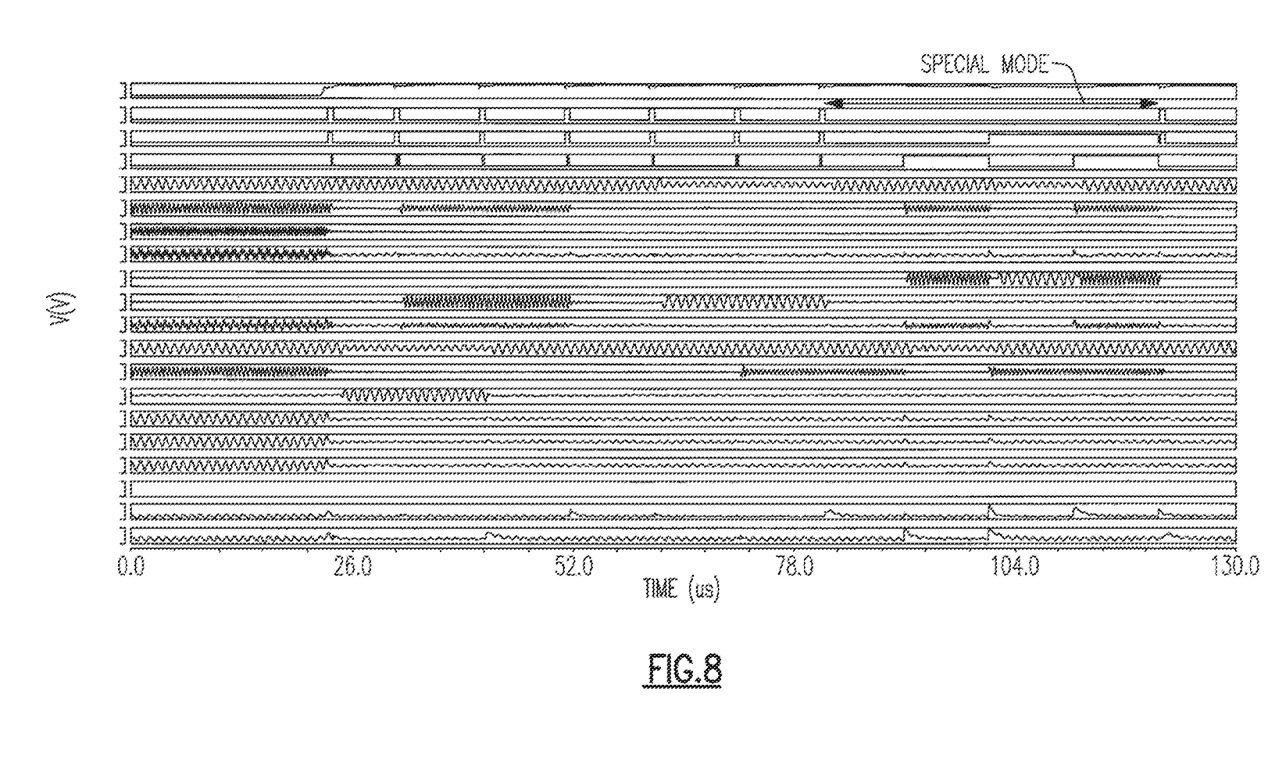
FIG. 8 is a graph illustrating example signals in a wireless device.

FIG. 8 is a graph illustrating example signals in a wireless device. As illustrated in FIG. 8, during the special mode, the controller 25 does not provide a fast clock signal via the CLK2 ("S_CLK") signal line.

Other Embodiments

The clock and data signal lines (e.g., CLK2 and DATA2 of the controller 25 illustrated in FIG. 4) can provide other types of control. For example, these signal lines can be used to provide carrier aggregation down link asynchronous TX/RX control (e.g., to change the state of the switches from TX to RX with just changing the state of the CLK2 and DATA2 from low to high or from high to low), debugging mode for silicon on insulator (SOI) switches (e.g., to disable the oscillator and charge pump for investigating clock interference), low current standby mode for slave devices, and use as a trigger for serially transmitted signals so that only intended state changes are made. In some of such embodiments or any other embodiments, the CLK2 and DATA2 can be used to control a component other than a coupler (e.g., directional coupler 24). For example, in a carrier aggregation mode, there may be 2 RF paths operating at the same time. In such a mode, two band switches may be controlled using the CLK2 and DATA2 signals. Some or all of these implementations can provide control without having a fast clock signal present when one of the bands is possibly transmitting, thereby reducing the chance of interference with the RF output from the serial interface clock signal.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions is not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency module comprising:
at least one radio frequency component; and
a controller including at least one output terminal, the at least one output terminal connected to the at least one radio frequency component, the controller configured to, in a first operating mode, implement a synchronous communication protocol on the at least one output terminal, and in a second operating mode, implement an asynchronous communication protocol on the at least one output terminal.

2. The radio frequency module of claim 1 wherein the at least one radio frequency component includes at least a switch and a coupler.

3. The radio frequency module of claim 2 wherein the controller is further configured to output an enable signal based at least on a determination that the radio frequency module is in the first operating mode such that control of the switch using the synchronous communication protocol is enabled.

4. The radio frequency module of claim 3 wherein the controller is disabled from controlling the coupler while control of the switch using the synchronous communication protocol is enabled.

5. The radio frequency module of claim 3 wherein a state of the coupler remains unchanged until the radio frequency module is no longer in the first operating mode.

6. The radio frequency module of claim 2 wherein the controller is further configured to output an enable signal based at least on a determination that the radio frequency module is in the second operating mode such that control of the switch using the synchronous communication protocol is disabled.

7. The radio frequency module of claim 6 wherein the controller is further configured to control the coupler using the asynchronous communication protocol while control of the switch using the synchronous communication protocol is disabled.

8. The radio frequency module of claim 1 wherein the radio frequency module is a power amplifier module.

9. The radio frequency module of claim 1 wherein the controller is further configured to determine whether the radio frequency module is in the first operating mode or in the second operating mode based at least on a data input signal.

10. The radio frequency module of claim 1 wherein the radio frequency module is further configured to refrain from outputting data for transmission via one or more antennas connected to the radio frequency module in the first operating mode.

11. The radio frequency module of claim 10 wherein the radio frequency module is further configured to output data for transmission via the one or more antennas in the second operating mode.

12. A method for controlling one or more components of a radio frequency module in a wireless communication device, the method comprising:
  determining that the radio frequency module is in a first operating mode;
  implementing a synchronous communication protocol on at least one output terminal connected to at least one radio frequency component of the radio frequency module;
  determining that the radio frequency module is in a second operating mode; and
  in response to said determining that the radio frequency module is in the second operating mode, implementing an asynchronous communication protocol on the at least one output terminal.

13. The method of claim 12 wherein the at least one radio frequency component includes at least a switch and a coupler.

14. The method of claim 13 further comprising outputting an enable signal based at least on a determination that the radio frequency module is in the first operating mode such that control of the switch using the synchronous communication protocol is enabled.

15. The method of claim 14 further comprising refraining from controlling the coupler while control of the switch using the synchronous communication protocol is enabled.

16. The method of claim 14 further comprising maintaining a state of the coupler until the radio frequency module is no longer in the first operating mode.

17. The method of claim 13 further comprising outputting an enable signal based at least on a determination that the radio frequency module is in the second operating mode such that control of the switch using the synchronous communication protocol is disabled.

18. The method of claim 17 further comprising controlling the coupler using the asynchronous communication protocol while control of the switch using the synchronous communication protocol is disabled.

19. A wireless communication device comprising:
  a transceiver;
  an antenna; and
  a radio frequency module in communication with the transceiver and the antenna and having a controller and at least one radio frequency component, the controller including at least one output terminal, the at least one output terminal connected to the at least one radio frequency component, the controller configured to, in a first operating mode, implement a synchronous communication protocol on the at least one output terminal, and in a second operating mode, implement an asynchronous communication protocol on the at least one output terminal.

20. The wireless communication device of claim 19 wherein the controller is further configured to refrain from controlling the at least one radio frequency component using the synchronous communication protocol while the wireless communication device is transmitting data via the antenna.

* * * * *